US006753606B2

(12) United States Patent
Cabral, Jr. et al.

(10) Patent No.: US 6,753,606 B2
(45) Date of Patent: Jun. 22, 2004

(54) METHOD AND STRUCTURE FOR REDUCTION OF CONTACT RESISTANCE OF METAL SILICIDES USING A METAL-GERMANIUM ALLOY

(75) Inventors: Cyril Cabral, Jr., Ossining, NY (US); Roy Arthur Carruthers, Stormville, NY (US); James McKell Edwin Harper, Yorktown Heights, NY (US); Christian Lavoie, Ossining, NY (US); Ronnen Andrew Roy, Ossining, NY (US); Yun Yu Wang, Poughguag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/994,954

(22) Filed: Nov. 27, 2001

(65) Prior Publication Data
US 2002/0042197 A1 Apr. 11, 2002

Related U.S. Application Data

(62) Division of application No. 09/519,897, filed on Mar. 6, 2000, now Pat. No. 6,331,486.

(51) Int. Cl.⁷ .................... H01L 23/48; H01L 23/52; H01L 29/40
(52) U.S. Cl. .................. 257/743; 257/754; 257/757
(58) Field of Search .................. 257/743, 754, 257/757, 768, 770

(56) References Cited

U.S. PATENT DOCUMENTS

| | | | |
|---|---|---|---|
| 5,510,295 A | * | 4/1996 | Cabral et al. ............ 438/656 |
| 5,608,226 A | | 3/1997 | Yamada et al. |
| 5,624,869 A | | 4/1997 | Agnello et al. |
| 5,710,450 A | * | 1/1998 | Chau et al. ............ 257/19 |
| 5,828,131 A | | 10/1998 | Cabral, Jr. et al. |
| 5,830,775 A | * | 11/1998 | Maa et al. ............ 438/141 |
| 6,121,100 A | * | 9/2000 | Andideh et al. ......... 257/336 |
| 6,165,826 A | * | 12/2000 | Chau et al. ............ 438/226 |
| 6,211,560 B1 | * | 4/2001 | Jimenez et al. ......... 257/451 |
| 6,326,664 B1 | * | 12/2001 | Chau et al. ............ 257/19 |

OTHER PUBLICATIONS

Wolf, Silicon Processing for the VLSI Era, vol. 2–Process Integration, Lattice Press: Sunset Beach CA, 1990, pp. 144–151.*
M. Lawrence, et al., "Growth of Epitaxial $CoSi_2$ on (100)Si," Appl. Phys. Lett., vol. 58, No. 12, pp. 1308–1310 (1991).
C. Cabral, et al., "In–Situ X–Ray Diffractin and Resistivity Analysis of CoSi2 Phase Formation With and Without a Ti Interlayer at Rapid Thermal Annealing Rates," Mat. Res. Soc. Symp. Proc., vol. 375, pp. 253–258 (1995).

* cited by examiner

Primary Examiner—Erik Kielin
(74) Attorney, Agent, or Firm—Scully, Scott, Murphy & Presser; Robert M. Trepp, Esq.

(57) ABSTRACT

A method of reducing the contact resistance of metal silicides to the p+ silicon area or the n+ silicon area of the substrate comprising: (a) forming a metal germanium (Ge) layer over a silicon-containing substrate, wherein said metal is selected from the group consisting of Co, Ti, Ni and mixtures thereof; (b) optionally forming an oxygen barrier layer over said metal germanium layer; (c) annealing said metal germanium layer at a temperature which is effective in converting at least a portion thereof into a substantially non-etchable metal silicide layer, while forming a Si—Ge interlayer between said silicon-containing substrate and said substantially non-etchable metal silicide layer; and (d) removing said optional oxygen barrier layer and any remaining alloy layer. When a Co or Ti alloy is employed, e.g., Co—Ge or Ti—Ge, two annealing steps are required to provide the lowest resistance phase of those metals, whereas, when Ni is employed, a single annealing step forms the lowest resistance phase of Ni silicide.

11 Claims, 4 Drawing Sheets

METHOD AND STRUCTURE FOR REDUCTION OF CONTACT RESISTANCE OF METAL SILICIDES USING A METAL-GERMANIUM ALLOY

RELATED APPLICATIONS

This application is a divisional application of U.S. application Ser. No. 09/519,897, filed on Mar. 6, 2000 now U.S. Pat. No. 6,331,486.

FIELD OF THE INVENTION

The present invention relates to complementary metal oxide semiconductor (CMOS) manufacturing, and more particular to a method for reducing contact resistance of a metal silicide contact by using a metal germanium alloy as the starting material for the metal silicide.

BACKGROUND OF THE INVENTION

As the dimensions in complementary metal oxide semiconductor (CMOS) devices are continually reduced, the drive current in such devices becomes limited by the parasitic series resistance of the ohmic contacts. The reduction in contact hole area drives the search for materials that can form an ohmic contact with very low resistivity.

One type of material commonly employed in fabricating ohmic contacts is metal silicides such as cobalt silicide. Cobalt silicide and other metal silicides are typically fabricated using a conventional self-aligned silicide (salicide) process, wherein a blanket TiN/Co film is deposited over the devices and annealed to form cobalt monosilicide over the exposed silicon regions (source, drain and gate) of transistors. A selective wet etch is employed to remove the TiN cap and the non-reacted cobalt left over the oxide or nitride regions. The cobalt monosilicide is then subjected to a second anneal which converts the monosilicide into a cobalt disilicide layer.

Although silicides of Ti, Co and Ni offer some of the properties needed to this point, an improvement in resistance of the ohmic contact is definitely needed for future generation of devices.

The Schottky barrier heights of a given material on n+ and p+ silicon substrates must add to 1.13 eV, the band gap of silicon. It is difficult however to find a material that lowers the contact resistance to both p-type and n-type material.

One obvious solution to the above problem is to use different materials for n- and p-type areas of a circuit. This, however, is not a financially suitable solution since it adds many additional processing steps to the overall fabrication scheme.

In view of the above-mentioned drawbacks with prior art processes, there is a continued need for developing a new and improved method of reducing contact resistance of metal silicides to at least the p+ Si area of the substrate.

SUMMARY OF THE INVENTION

The present invention provides a method which overcomes the above mentioned drawbacks with prior art salicide processes. This is achieved in the present invention by utilizing Co—Ge, Ti—Ge, Ni—Ge or mixtures thereof (herein referred to as metal germanium alloys) as a starting material for fabricating metal silicide contacts. The use of the aforementioned metal Ge alloys significantly reduces the contact resistance of silicide contacts to the p+ silicon area or the n+ silicon area of the substrate. Such reduction in contact resistance has not been observed utilizing any prior art process known to applicants; therefore the present invention provides a significant advancement in the art of fabricating CMOS devices having low resistivity ohmic contacts.

Specifically, the method of the present invention which is capable of reducing the contact resistance of metal silicides to the p+ silicon area or the n+ silicon area of the substrate comprises the steps of:

(a) forming a metal germanium (Ge) alloy layer over a silicon-containing substrate, wherein said metal of said alloy layer is selected from the group consisting of Co, Ti, Ni and mixtures thereof;

(b) optionally forming an oxygen barrier layer over said metal germanium alloy layer;

(c) annealing said metal germanium alloy layer at a temperature which is effective in converting at least a portion thereof into a metal silicide layer that is substantially non-etchable compared to the unreacted metal germanium alloy layer, while forming a Si—Ge interlayer between said silicon-containing substrate and said substantially non-etchable metal silicide layer;

(d) removing said optional oxygen barrier layer and any remaining metal Ge alloy layer, with the proviso that when Co and Ti are employed, a second annealing step is employed after the removing step which converts the substantially non-etchable metal silicide layer into Co disilicide or the C54 phase of $TiSi_2$, i.e., lowest resistance silicide phases of Co and Ti, respectively.

In an optional embodiment of the present invention and when Co is employed, a pre-annealing step is carried out between steps (a) and (c) or (b) and (c) at an annealing temperature which is sufficient to form a metal rich germanium silicide phase layer in the structure. Typically, the pre-annealing step is carried out at a temperature that is lower than the temperature used in forming the etch resistant metal silicide layer and the Si—Ge interlayer.

When Ni is employed as the metal, Ni monosilicide is formed after a single annealing step. Not only is Ni monosilicide etch resistant, but it represents the lowest resistance silicide phase of Ni. On the other hand, when Co and Ti are employed, two annealing steps are required in forming the lowest resistance silicide phase. For example, when Co is employed, the first annealing step converts the Co—Ge alloy layer into a Co monosilicide layer (a substantially non-etchable, high resistance silicide phase of Co) and thereafter a second annealing step is used to convert the substantially non-etchable silicide phase into a Co disilicide phase (lowest resistance phase of Co silicide). In the case of Ti, the first anneal forms the C49 phase of $TiSi_2$ (a substantially non-etchable, high resistance Ti silicide phase) and the second anneal converts the etch resistant silicide phase into a C54 phase (lowest resistance disilicide phase of Ti). When the second anneal is employed, the second annealing step is carried out at a temperature that is greater than the temperature used to form the substantially non-etchable metal silicide, i.e., Co monosilicide or the C49 phase of $TiSi_2$. It should be noted that the term "substantially non-etchable" denotes a material that is difficult to etch in the etchant solutions mentioned hereinbelow; the material is more difficult to etch than the unreacted metal germanium alloy layer.

Another aspect of the present invention relates to low resistivity electrical contacts that are formed utilizing the method of the present invention. In accordance with one aspect of the present invention, a low resistance electrical contact to a region of a silicon-containing substrate is provided that comprises: a substrate having an exposed region of a silicon-containing semiconductor material and a first layer of a metal silicide being in its lowest resistance phase, wherein said metal is selected from the group consisting of Ni, Co, Ti and mixtures thereof, and said substrate and said first layer are separated by a Si—Ge interlayer.

When Ni is employed, the metal silicide contact is composed mainly of the monosilicide phase, when Co is employed, the metal silicide contact is composed mainly of the disilicide phase; and, when Ti is employed, the metal silicide contact is composed mainly of the C54 phase of $TiSi_2$. Each of the above mentioned phases, represent the lowest resistance phase of the metal silicide.

DETAILED DESCRIPTION OF THE INVENTION

Figure 1A:
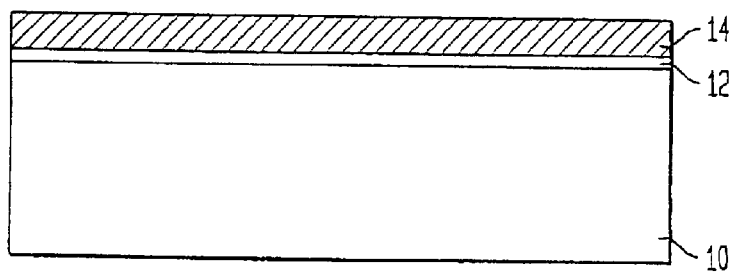
FIGS. 1a–f are cross-sectional views illustrating various structures that are formed during the different processing steps of the present invention.

The present invention, which is directed to a method and structure for the reduction of contact resistance of metal silicide contacts, will now be described in greater detail by referring to the drawings that accompany the present application. It should be noted that in the accompanying drawings like and/or corresponding elements are referred to by like reference numerals.

Reference is first made to FIGS. 1a–f which illustrate the basic processing steps of the present invention that are capable of forming a CMOS structure in which the contact resistance of the metal silicide has been significantly reduced to that of the p+ silicon area of the substrate or the n+ silicon area of the substrate by utilizing a metal Ge alloy as the silicide starting material.

Specifically, the structure shown in FIG. 1a comprises a Si-containing substrate 10 which has a metal germanium alloy layer 14 formed thereon. The Si-containing substrate may optionally include a thin oxide layer 12 that is present near the surface of the Si-containing substrate; the oxide layer is at the interface between the alloy layer and the Si-containing substrate. Suitable Si-containing substrates that can be used herein include, but are not limited to: single crystal Si, polycrystalline Si, SiGe, amorphous Si, silicon-on-insulator (SOI) and other like Si-containing materials. Typically, the oxide layer is a thin oxide having a thickness of from about 0.1 to about 3.0 nm.

In one embodiment of the present invention, oxide layer 12 is completely removed from the structure prior to employing the method of the present invention. In this embodiment, HF may be used to completely remove the oxide layer from the structure prior to forming the metal Ge alloy layer thereon.

The Si-containing substrate may be doped or undoped and it may contain various isolation and device regions therein. These regions are not shown in the drawings but are nevertheless intended to be included in region 10.

The metal germanium alloy layer is formed on the surface of substrate 10 (or over oxide layer 12) using conventional deposition processes that are well known to those skilled in the art. For example, the alloy layer may be formed by chemical vapor deposition, plasma-assisted chemical vapor deposition, evaporation, sputtering and other like deposition processes. Of these techniques, it is preferred to form the alloy layer by sputtering. Alternatively, the metal Ge alloy layer may be formed by first depositing a metal layer on the surface of the Si-containing substrate, and thereafter doping the metal layer with at least Ge utilizing ion-implantation or other like doping process.

The metal germanium alloy layer of the present invention comprises at least one metal selected from the group consisting of Co, Ti, Ni and mixtures thereof. That is, layer 14 may comprise a Co—Ge alloy, a Ti—Ge alloy, a Ni—Ge alloy or a mixture of metals such as Co—Ti—Ge. Of these alloys, it is preferred that the metal germanium alloy comprise a Co—Ge alloy. The metal germanium alloy layer of the present invention includes 0.01 to 50 atomic % Ge. More preferably, germanium is present in the alloy layer in an amount of from about 0.1 to about 20 atomic %.

The metal germanium alloy layer of the present invention may also include at least one additive, said at least one additive being selected from the group consisting of C, Al, Si, Sc, Ti, V, Cr, Mn, Fe, Co, Ni, Cu, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho, Er, Tm, Yb and Lu. Of these alloy additives C, Al, Si, Sc, Ti, V, Cr, Mn, Fe, Co, Ni, Cu, Y, Zr, Nb, Mo, Ru, Rh, Pd, In, Sn, La, Hf, Ta, W, Re, Ir, Pt or mixtures thereof are highly preferred, with Si, Ti, V, Cr, Ni, Nb, Rh, Ta, Re, Ir or mixtures thereof being even more highly preferred. When an additive is present, the at least one additive is present in an amount of from about 0.01 to about 50 atomic (at.) %, with a range of from about 0.1 to about 20 at. % being more preferred. Mixtures of one or more of these additives are also contemplated herein.

The term "metal germanium alloy" is used herein to include Co, Ti or Ni compositions that have a uniform or non-uniform distribution of germanium therein; Co, Ti or Ni compositions having a gradient distribution of germanium therein; or mixtures and compounds thereof.

Figure 1B:
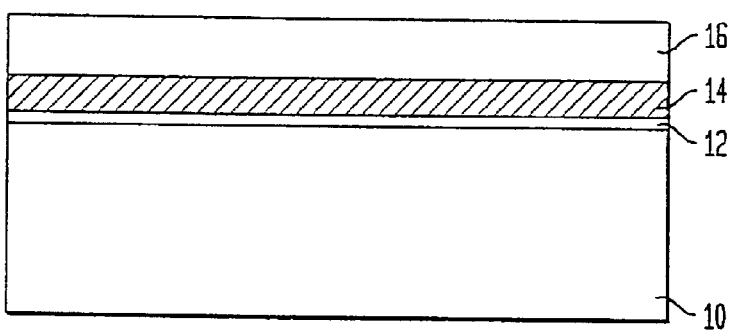

Next, as shown in FIG. 1b, an optional oxygen barrier layer 16 may be formed on the surface of metal germanium alloy layer 14. The optional oxygen barrier layer is formed using conventional deposition processes that are well known to those skilled in the art. Illustrative examples of suitable deposition processes that can be employed in the present invention in forming the optional oxygen barrier layer include, but are not limited to: chemical vapor deposition, plasma-assisted chemical vapor deposition, sputtering, evaporation, plating, spin-on coating and other like deposition processes. The thickness of the optional oxygen barrier layer is not critical to the present invention as long as the oxygen barrier layer is capable of preventing oxygen or another ambient gas from diffusing into the structure. Typically, the optional oxygen barrier layer has a thickness of from about 10 to about 30 nm.

The optional oxygen barrier is composed of conventional materials that are well known in the art for preventing oxygen from diffusing into the structure. For example, TiN, $Si_3N_4$, TaN and other like materials can be employed as the oxygen barrier layer. Although the drawings of the present invention show the presence of the optional barrier layer, it is possible to use the method of the present invention in cases wherein the optional barrier layer is not present. Typically, the optional barrier layer is not employed when a Ti—Ge alloy is employed.

Figure 1C:
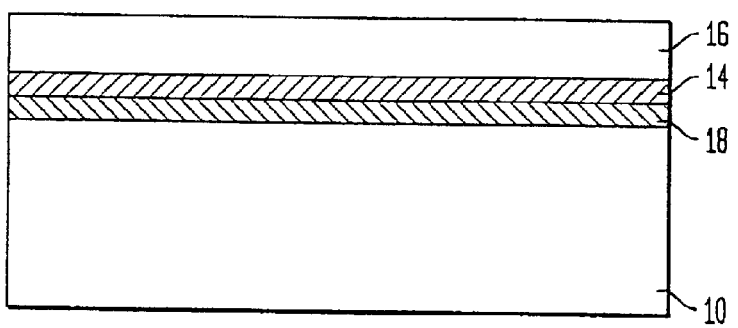

The structure shown in FIG. 1b may optionally be pre-annealed under conditions that are sufficient in forming a metal rich germanium silicide phase layer 18 in the structure (See FIG. 1c). It should be noted that oxide layer 12 becomes part of the silicide layer after annealing. Pre-annealing is carried out using a rapid thermal anneal (RTA) process. Typically, the optional pre-annealing step is carried out in a gas atmosphere, e.g., He, Ar, $N_2$ or forming gas, at a temperature of from about 350° to about 450° C. for a time period of about 300 seconds or less using a continuous heating regime or a ramp and soak heating regime. Other temperatures and times are also contemplated herein so long as the conditions chosen are capable of forming at least the metal rich germanium silicide layer in the structure.

Figure 1D:
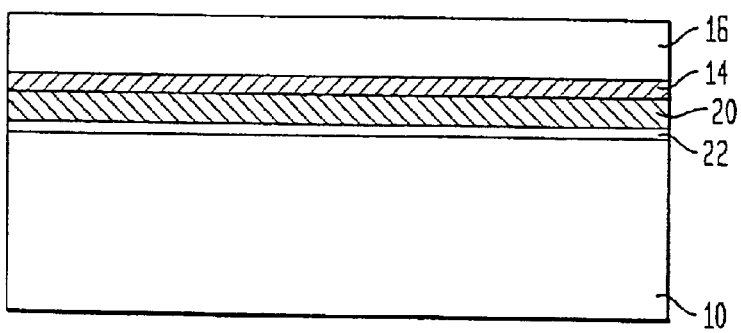
Figure 1E:
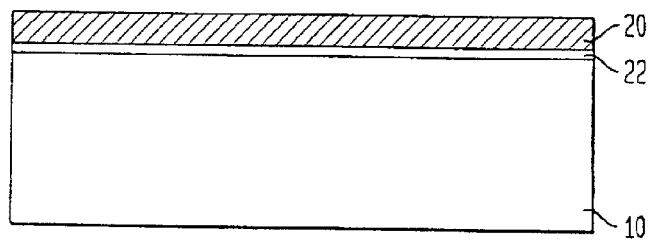

In accordance with the next step of the present application, See FIG. 1d, at least one annealing step is carried out on the structure shown in FIG. 1b or optionally FIG. 1c so as to form a metal silicide layer 20 and a Si—Ge interlayer 22 in the structure; the interlayer separates the silicide layer from the substrate. It is noted that during this annealing step of the present invention the Ge diffuses to the interface formed between the substrate and the metal germanium alloy layer. To form the silicide layer and the Si—Ge interlayer in the structure, annealing is carried out using a rapid thermal anneal (RTA) process using a gas atmosphere, e.g., He, Ar, Ne or forming gas, at a temperature of from about 400° to about 700° C. for a time period of about 300 seconds or less using a continuous heating regime or a ramp and soak heating regime. Other temperatures and times are also contemplated herein so long as the conditions chosen are capable of forming silicide layer 20 and interlayer 22 in the structure. It is noted that when the optional pre-annealing step is employed, the annealing temperatures used in the formation of the silicide layer and the Si—Ge interlayer are higher than the pre-annealing temperatures. It is further emphasized that during the annealing step the metal germanium alloy layer may be completely depleted of Ge or some Ge may remain therein.

In the case of Ni, the above annealing step forms a Ni monosilicide phase, which phase is substantially non-etchable and is the lowest resistance phase of Ni silicide. In the case of Co and Ti, the above annealing step, i.e., first annealing step, forms a Co monosilicide phase and a C49 phase of $TiSi_2$, respectively. Both of these silicide phases of Co and Ti are substantially non-etchable, but they are not representative of the lowest resistance phase of the metal silicide. In the case of Co and Ti, a second annealing step is required to convert the substantially non-etchable silicide phase material into the lowest resistance silicide phase of the material. The second anneal will be described in more detail hereinbelow.

After the first annealing step, optional oxygen diffusion barrier 16 and any remaining metal germanium alloy layer 14 (or any pure metal layer) is removed from the structure (See, FIG. 1e) using conventional etching techniques that are well known to those skilled in the art. For example, any wet etch process may be used in removing the optional oxygen barrier layer and the metal germanium alloy layer from the structure. The chemical etchant employed in the wet etch process must be highly selective in removing the oxygen barrier layer and the metal germanium alloy layer as compared to the metal silicide layer. A suitable etchant that can be employed in the present invention is a mixture of hydrogen peroxide and nitric or sulfuric acid. Other chemical etchants can also be employed in the present invention. The above etchants are highly selective in removing the non-reacted material than the corresponding silicide phase formed in the first annealing step mentioned above.

It is also within the contemplation of the present invention to use a dry etch process in removing the optional oxygen barrier layer and any remaining alloy layer from the structure. Suitable dry etching techniques that can be used herein include, but are not limited to: reactive-ion etching, ion beam etching, plasma etching and other like dry etching techniques.

Figure 1F:
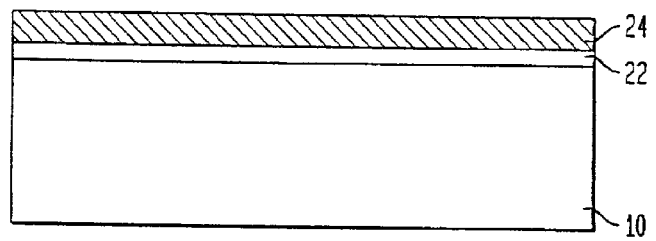

As stated above, when a Ni—Ge alloy is employed, an electrical contact is formed after the first annealing step mentioned above and the subsequent removal step. When a Co—Ge or Ti—Ge alloy is employed, further annealing is required which converts the high resistance silicide phase of Co or Ti into a Co or Ti silicide phase of lower resistance, i.e., Co disilicide or the C54 phase of $TiSi_2$. The second annealing step is carried out at a temperature that is higher than the temperature used in either the pre-anneal or first annealing step. The second annealing step is thus carried out under conditions that are effective in converting silicide layer 20 into a silicide layer 24 having a lower resistance than silicide layer 20. This second annealing step is also carried out by RTA using a gas ambient. Typically, the second annealing step is carried out at a temperature of about 700° to about 900° C. for a time period of from about 300 seconds or less using a continuous heating regime or a ramp and soak heating regime. Other temperatures and times are also contemplated herein so long as the conditions chosen are higher than the pre-anneal and the first anneal steps so that the lowest resistance silicide phase of Co or Ti is formed in the structure. The resultant structure that is obtained using the second annealing step of the present invention is shown in FIG. 1f.

It is noted that if substrate 10 was not previously doped, it can be doped after the first or the second annealing steps using conventional techniques well known to those skilled in the art.

The electrical contact of the present invention thus comprises a substrate 10 having an exposed region of a silicon-containing semiconductor material and a first layer of a metal disilicide 24, wherein said metal of said disilicide is selected from the group consisting of Co, Ti and mixtures thereof, and said substrate and said first layer are separated by a Si—Ge interlayer 22.

When a Ni alloy is used, the electrical contact comprises a substrate 10 having an exposed region of a silicon-containing semiconductor material and a first layer of Ni-monosilicide 20, wherein said substrate and said first layer are separated by a Si—Ge interlayer 22.

It is noted that Ni monosilicide is the lowest resistance phase of Ni silicide, whereas the disilicide phase of Co and Ti (C54) are the lowest resistance silicide phase of those two metals, respectively.

The present examples are given to illustrate the present invention and to demonstrate some of the advantages that can arise therefrom.

EXAMPLES

In these examples, a structure containing a Co disilicide was prepared from pure Co using a conventional salicide process (representative of the prior art) and that structure was compared to a structure containing a Co disilicide contact made in accordance with the present invention, i.e., a Co—Ge alloy was used as the silicide starting material. Specifically, the prior art structure was prepared by depositing a blanket TiN/Co film over a Si substrate and the structure was then subjected to RTA (T of about 550° C.) to form Co monosilicide over the exposed silicon regions (source, drain and gate) of the transistors. A selective wet etch was employed to remove the TiN cap and the non-reacted Co left over the oxide or nitride regions. The Co monosilicide thus formed was then subjected to a second anneal (T about 750° C.) to form a Co disilicide layer.

In the other structure, a Co—Ge alloy (containing about 2 atomic % Ge) was used instead of the pure Co and the above processing conditions were then used to form a Co disilicide layer on the substrate with the exception of the disilicide anneal which was conducted at a temperature of about 800° C.

By using Co—Ge alloy instead of pure Co, the following observation were seen:

After formation of the monosilicide, TEM structural analysis showed that the Ge had segregated to the interface between the silicide and the Si substrate.

The structure after the selective wet etch consisted of the Si substrate, a Si—Ge interlayer and a Co monosilicide top layer.

The Si—Ge interlayer remained at the interface during the second anneal.

Si was the main diffusing species during the disilicide formation (it is normally Co that diffuses at this stage) as it moved through the Si—Ge interlayer.

The disilicide formation occurred at a higher temperature than that of pure Co.

The final structure was composed of the Si substrate, an interlayer of Si—Ge and an upper layer of Co disilicide that contained little Ge.

Figure 2A:
FIGS. 2a–b are transmission electron microscopy (TEMs) of a Co disilicide film made from pure Co (representative of prior art salicide processes) showing maximum roughness (2a) and minimum roughness (2b).
Figure 2B:
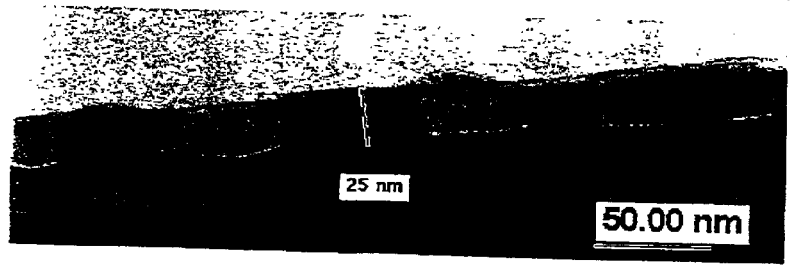
Figure 3:
FIG. 3 is a TEM of a Co disilicide film formed from a Co (2 atomic % Ge) alloy (representative of the present invention).
Figure 4:
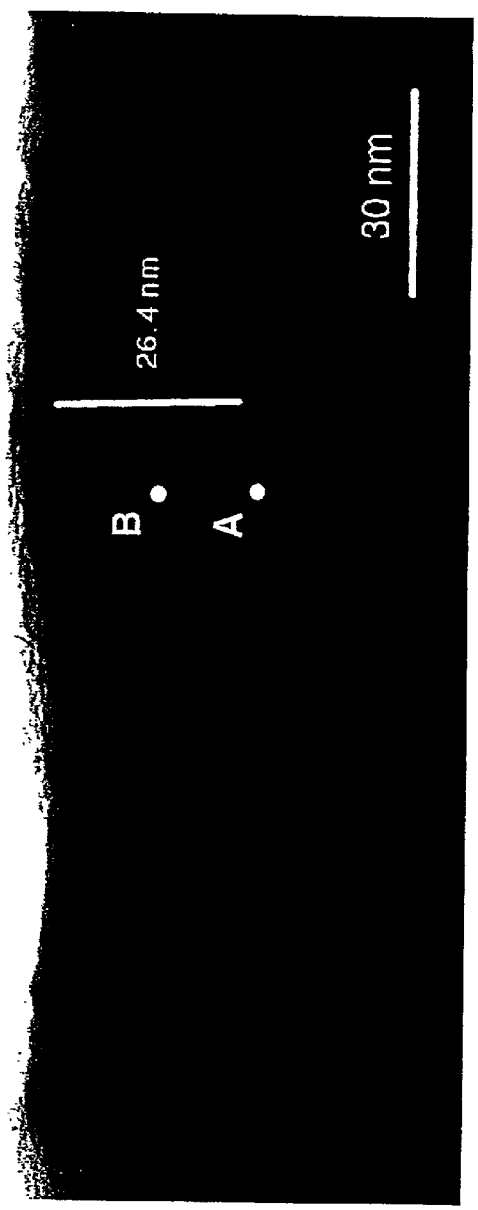
FIG. 4 is a TEM of a Co disilicide film formed from a Co (2.1 at. % Ge) alloy. Point A and B represent the points on which local analysis (Energy Dispersive X-ray (EDX)) was performed; Point A is in the Ge rich interlayer and Point B is in the disilicide layer.

The following TEMs support the above statements. Specifically, FIGS. 2a and 2b are two TEM images showing the Co disilicide made from pure Co (maximum roughness, FIG. 2a, and minimum roughness, FIG. 2b) and FIG. 3 is a TEM image showing the Co disilicide made from a Co—Ge alloy. Note the darker region at the interface is the Si—Ge compound. FIG. 4 is a higher magnification TEM showing the results of the salicide process when a Co—Ge alloy was employed. Point A and B represent the points at which local analysis (EDX) was performed. Point A is the Ge rich interlayer and point B is the Co disilicide layer.

Figure 5:
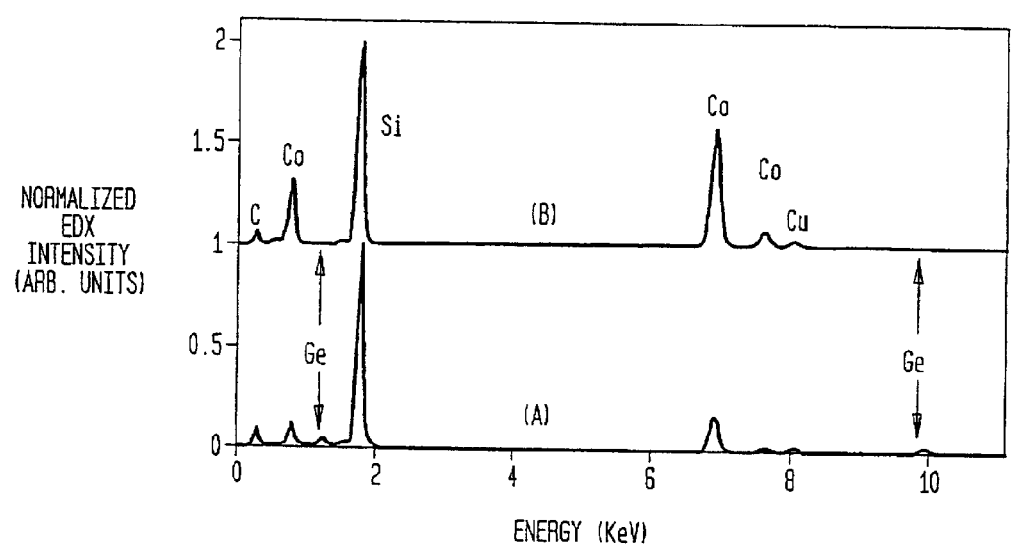
FIG. 5 is the EDX analysis (Normalized EDX Intensity, arb. units vs. Energy, KeV) at Point A and B of FIG. 4.

The EDX analysis at points A and B is shown in FIG. 5. Specifically, the traces shown in the figure have been normalized to 1 for the Si peak. While no Ge is observed in the Co disilicide layer (B), the presence of Ge at the interface is clear. The Co concentration shows a clear decrease from the disilicide layer to the interface layer. The Co signal at the interface (point A) could simply be the result of the probe size (3 nm) which is larger than the interface layer thickness. C and Cu peaks are caused by contamination and the use of a Cu grid in the TEM preparation.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An electrical contact to a region of a silicon-containing substrate comprising:

a substrate having an exposed region of a silicon-containing semiconductor material; and a first layer of metal disilicide which includes an additive or Ge, wherein said metal of said disilicide is selected from the soup consisting of Ti, Co and mixtures thereof, and said exposed region of said substrate and said first layer are separated by a Si—Ge interlayer, wherein said Si—Ge interlayer has a thickness less than about 3.0 nm.

2. The electrical contact of claim 1 wherein said silicon-containing semiconductor material comprises single crystal Si, polycrystalline Si, SiGe, amorphous Si or a silicon-on-insulator (SOI).

3. The electrical contact of claim 1 wherein said metal of said disilicide is Co and said metal silicide is Co disilicide.

4. The electrical contact of claim 1 wherein said metal of said disilicide is Ti and said metal silicide is $TiSi_2$.

5. The electrical contact of claim 4 wherein said $TiSi_2$ is in the C54 phase.

6. The electrical contact of claim 1 wherein said substrate is doped.

7. The electrical contact of claim 1 wherein said additive is selected from the group consisting of C, Al, Si, Sc, Ti, V, Cr, Mn, Fe, Co, Ni, Cu, Y, Zr, Nb, Mo, Ru, Rh, Pd, In, Sn, La, Hf, Ta, W, Re, Ir, Pt, Ce, Pr, Nd, Sm, Eu, Gd, Tb, Dy, Ho, Er, Tm, Yb, Lu and mixtures thereof.

8. The electrical contact of claim 7 wherein said additive is C, Al, Si, Sc, Ti, V, Cr, Mn, Fe, Co, Ni, Cu, Y, Zr, Nb, Mo, Ru, Rh, Pd, In, Sn, La, Hf, Ta, W, Re, Ir, Pt or mixtures thereof.

9. The electrical contact of claim 8 wherein said additive is Si, Ti, V, Cr, Ni, Nb, Rb, Ta, Re, Ir or mixtures thereof.

10. The electrical contact of claim 1 wherein said additive is present in said metal disilicide in an amount of from about 0.01 to about 50 atomic percent.

11. An electrical contact to a region of a silicon-containing substrate comprising:

a substrate having an exposed region of a silicon-containing semiconductor material; and a first layer of metal disilicide, wherein said metal of said disilicide is selected from the group consisting of Ti, Co and mixtures thereof, and said exposed region of said substrate and said first layer are separated by a Si—Ge interlayer positioned on an interface between said first layer and said substrate, wherein said Si—Ge interlayer does not substantially extend beyond said interface.

* * * * *

UNITED STATES PATENT AND TRADEMARK OFFICE
CERTIFICATE OF CORRECTION

PATENT NO.     : 6,753,606 B2
DATED          : June 22, 2004
INVENTOR(S)    : Cyril Cabral, Jr. et al.

It is certified that error appears in the above-identified patent and that said Letters Patent is hereby corrected as shown below:

<u>Title page,</u>
Item [56], References Cited, OTHER PUBLICATIONS,
M. Lawrence et al., reference, "CoSi2" should read -- $CoSi_2$ --

<u>Column 8,</u>
Line 17, "soup" should read -- group --

Signed and Sealed this

Fifth Day of April, 2005

JON W. DUDAS
*Director of the United States Patent and Trademark Office*